United States Patent [19]

Takamatsu et al.

[11] Patent Number: 4,511,217
[45] Date of Patent: Apr. 16, 1985

[54] CURVED ELECTRODE PATTERN IN A LIQUID CRYSTAL COLOR DISPLAY CELL

[75] Inventors: Toshiaki Takamatsu, Nara; Keisaku Nonomura, Tenri, both of Japan

[73] Assignee: Sharp Kabushiki Kaisha, Osaka, Japan

[21] Appl. No.: 574,194

[22] Filed: Jan. 26, 1984

Related U.S. Application Data

[63] Continuation of Ser. No. 108,825, Dec. 31, 1979, abandoned, which is a continuation of Ser. No. 829,421, Aug. 31, 1977, abandoned.

[30] Foreign Application Priority Data

Sep. 7, 1976 [JP] Japan .................. 51-120840

[51] Int. Cl.³ ............................... G02F 1/13
[52] U.S. Cl. .................. 350/336; 350/347 E
[58] Field of Search ............ 350/336, 331 R, 347 E

[56] References Cited

U.S. PATENT DOCUMENTS

| 3,694,053 | 9/1972 | Kahn | 350/347 E |
| 3,785,721 | 1/1974 | Harsch | 350/347 E |
| 3,910,680 | 10/1975 | Kakeda | 350/347 E |
| 3,934,199 | 1/1976 | Channin | 350/347 E |
| 4,097,128 | 6/1978 | Matsumoto et al. | 350/347 E |

OTHER PUBLICATIONS

Scheffer, T. J., "Liquid Crystal Color Displays," *Nonemissive Electrooptic Displays*, (1975), pp. 45-78.
Matsumoto, S., et al., "New Multicolor Liquid-Crystal Display," *Toshiba Review*, No. 108, (Mar.-Apr. 1977), pp. 32-35.
Freiser, M. J., "Liquid Crystal Polychromatic Display Device," *IBM Disclosure Bull.*, vol. 15, No. 2, (Jul. 1972), pp. 700-701.
Sato, S. et al., "Frequency Color Display by Nematic Liquid Crystals," *Japan J. Appl. Phys.*, vol. 13, No. 3, (1974), pp. 559-560.

*Primary Examiner*—John K. Corbin
*Assistant Examiner*—Richard F. Gallivan
*Attorney, Agent, or Firm*—Birch, Stewart, Kolasch & Birch

[57] ABSTRACT

A curved electrode pattern is included within a liquid crystal color display cell to compensate for the differences of the thickness of the liquid crystal color display cell across one of the segmented electrode patterns, thereby providing a uniform color indication in the segmented electrode patterns. A sound color display representative of a sound intensity level is indicated in the liquid crystal color display cell to show the expanse and the transition of the sound intensity level as a color change in said liquid crystal color display cell in each of said segmented electrode patterns.

4 Claims, 7 Drawing Figures

CURVED ELECTRODE PATTERN IN A LIQUID CRYSTAL COLOR DISPLAY CELL

This is a continuation, of application Ser. No. 108,825 filed on Dec. 31, 1979, now abandoned, which was a continuation of U.S. application Ser. No. 829,421, filed Aug. 31, 1977, now abandoned.

BACKGROUND OF THE INVENTION

The present invention relates to a liquid crystal display device and, more particularly, to a configuration of a transparent electrode included within a liquid crystal color display device.

A uniform thickness of a liquid crystal color display cell is required in the liquid crystal color display cell, wherein a DAP (deformation of vertical aligned phases) system utilizes the known Fredericksz transition effect. When a retardation is varied in a segmented pattern due to the inequality of the thickness of the liquid crystal color display cell, various colors unavoidably emerge in the single segmented pattern. Arrangement of the prior segmented patterns included within the liquid crystal color display device were of a linear type. These displays were used, for example in a level indicator of an analog type provided within a stereo sound apparatus, wherein the sound voltage level applied to the stereo sound apparatus is to be indicated in color. These segmented patterns of the prior art do not correspond in shape to interference fringes emerging in the liquid crystal color display cell caused by the differences of the thickness of said display cell, whereby a uniform color indication in the segmented pattern is prevented by the variation of the retardation in the segmented pattern.

OBJECTS AND SUMMARY OF THE INVENTION

Accordingly, an object of the present invention is to provide an improved arrangement of transparent electrodes of a liquid crystal color display cell which enables a uniform color indication.

Another object of the present invention is to provide an improved liquid crystal color display cell, wherein various color displays corresponding to segmented electrodes included within the liquid crystal color display cell are indicated.

Other objects and further scope of applicability of the present invention will become apparent from the detailed description given hereinafter. It should be understood, however, that the detailed description and specific examples, while indicating preferred embodiments of the invention, are given by way of illustration only, since various changes and modifications within the spirit and scope of the invention will become apparent to those skilled in the art from this detailed description.

To achieve the above objectives, pursuant to an embodiment of the present invention, segmented electrodes are arranged in curved shapes of the appoximately corresponding to the interference fringes emerging in a liquid crystal color display, whereby the retardation included within said liquid crystal color display is made uniform to allow the various color indications to be controlled in accordance with the shapes segmented electrodes.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DESCRIPTION OF THE PREFERRED EMBODIMENT

Figure 1:
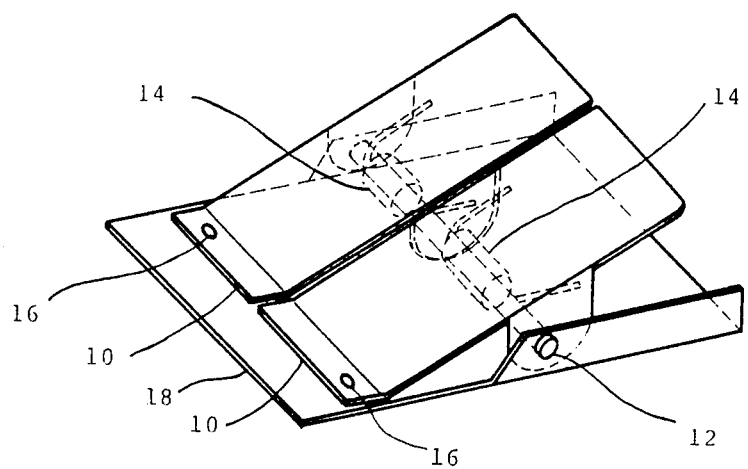
FIG. 1 is a perspective view of a tool for manufacturing an embodiment of a liquid crystal color display cell of the present invention.

FIG. 1 shows a tool for manufacturing an embodiment of a liquid crystal color display of the present invention, wherein two pressing plates for stressing the liquid crystal color display under uniform pressure are included.

Two pressing plates 10 are engaged to a shaft 12 through two springs 14, respectively. Uniform pressure is applied through two pressing plates 10. Two pressing tips 16 are provided within the two pressing plates 10, respectively, to stress the liquid crystal color display. The shaft 12 is held by a substrate 18.

Figure 2:
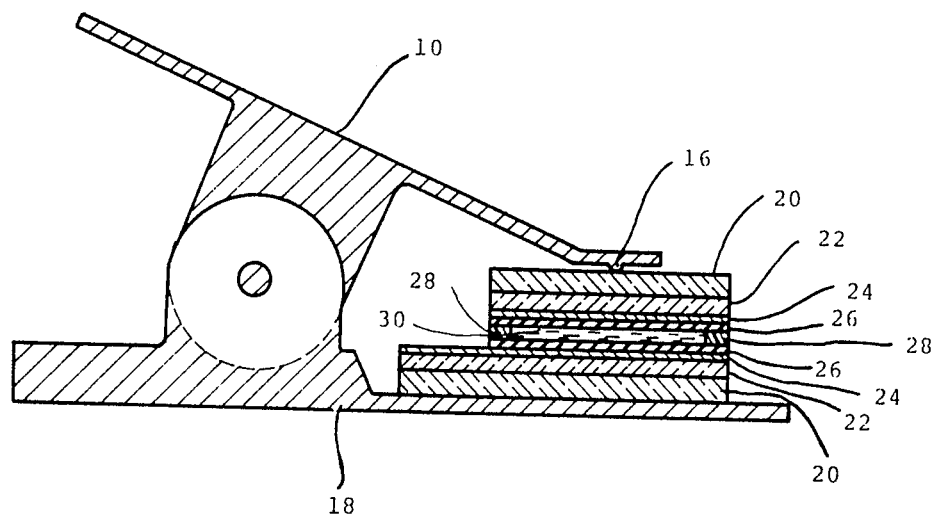
FIG. 2 is a sectional view of the tool shown in FIG. 1 and an embodiment of a liquid crystal color display cell of the present invention which is held by said tool.

FIG. 2 shows the tool shown in FIG. 1, said tool holding an embodiment of a liquid crystal color display cell of the present invention to manufacture it. The two pressing tips 16 are positioned at the center of the liquid crystal color display cell to impart uniform thickness thereto. Two pressing thick glass substrates 20 protect the liquid crystal color display cell during manufacture. The liquid crystal color display cell comprises glass substrates 22, transparent electrodes 24 made of indium oxide, insulative films 26 made of silicon dioxide or silicon monoxide, and sealing members 28 for sealing a liquid crystal composition 30. The transparent electrodes 24 are arranged on the glass substrates 22 through the use of etching techniques to determine the liquid crystal color display and the insulative films 26 are formed on the patterned transparent electrodes 24 to ensure the polarization and the reliability of the liquid crystal composition 30.

FIGS. 3($a$) and 3($b$) show interference fringes emerging under monochromatic light in the liquid crystal color display cell which has not yet been filled with liquid crystal composition 30 therein, said interference fringes being circular around the point stressed by the pressing tip 16 of the apparatus of FIGS. 1 and 2.

Figure 3A:
FIGS. 3($a$) and 3($b$) are plan views of interference fringes emerging on an embodiment of a liquid crystal color display cell of the present invention while the liquid crystal color display does not have a liquid crystal composition therein.
Figure 3B:
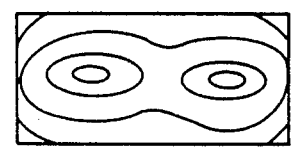
Figure 4:
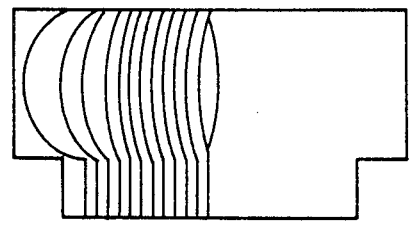
FIG. 4 is a plan view of a transparent electrode pattern provided within an embodiment of a liquid crystal display cell of the present invention, wherein a half of a transparent electrode pattern is omitted.

FIG. 4 shows curved electrode patterns provided within the liquid crystal color display cell of the present invention. Said curved electrode patterns compensate for the differences of the thickness of said liquid crystal color display cell in the single segmented electrode, thereby establishing a uniform color indicaton for each segmented electrode. The curved electrode patterns shown in FIG. 4 are to be applied to the liquid crystal color display cell which shows the interference fringes shown in FIG. 3(a) or 3(b).

The liquid crystal color display cell showing the interference fringes shown in FIG. 3(a) is more preferably used with the curved electrode patterns illustrated in FIG. 4. The liquid crystal color display cell showing the interference fringes shown in FIG. 3(b) is not quite as successful with the curved electrode patterns shown in FIG. 4, because the interference fringes are not coincidence with the curved electrode patterns in the center portion of said liquid crystal color display cell though matching is substantially achieved with the curved electrode patterns in the peripheral portions. However, this incongruity is not sufficient to preclude the provision of a color sound indication as described hereinafter.

Figure 5:
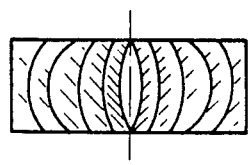
FIGS. 5 and 6 are plan views of the liquid crystal display cells of the present invention showing color indications, respectively.
Figure 6:
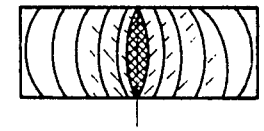

FIGS. 5 and 6 show stereophonic sound displays and monophonic sound display of the liquid crystal color displays cell having curved electrode patterns, respectively, a radius of curvature of said curved electrode patterns becoming smaller in the regions appoaching the peripheral portions thereof to increase the expansion of sound levels. The color sound display is not enabled at the center electrode pattern in FIG. 5, whereby the color sound displays can be compared at the right and left positions of the electrode pattern. The color sound displays are enabled in the entire electrode pattern in the monophonic sound display shown in FIG. 6, because comparison of the color sound displays in the right and left electrode patterns are not required.

The invention being thus described, it will be obvious that the same may be varied in many ways. Such variations are not to be regarded as a departure from the spirit and scope of the invention, and all such modifications are intended to be included within the scope of the following claims.

What is claimed is:

1. In a liquid crystal display cell having two substrate means, a plurality of electrode members formed on at least one of said substrate means for display purposes, spacer members positioned between said two substrate means, and a liquid crystal composition filled between said two substrate means, said liquid crystal display cell when having no liquid crystal composition filled between said two substrate means exhibiting characteristic curved shapes of interference fringes due to differences in thickness of said cell across the area of said cell, said curved shapes collectively defining a characteristic configuration of interference fringes across said area, the improvement comprising:

said electrode members being formed on one of said substrate means and being arranged in a generally curved pattern, said curved pattern being substantially symmetrical about and concave to a center line such that an improved uniformity of color indication is provided a segment of the display cell subtended by each electrode member.

2. In a sound level meter having a liquid crystal display cell which generates different colors corresponding to different sound intensity levels, said liquid crystal display cell having two substrate means, a plurality of electrode members formed on at least one of said substrate means for display purposes, spacer members positioned between said two substrate means, and a liquid crystal composition filled between said two substrate means, said liquid crystal cell when having no liquid crystal composition filled between said two substrate means exhibiting characteristic curved shapes of interference fringes due to differences in thickness of said cell across the area of said cell, said curved shapes collectively defining a characteristic configuration of interference fringes across said area, the improvement comprising:

said electrode members being formed on one of said substrate means and being arranged in a generally curved pattern, said curved pattern being substantially symmetrical about and concave to a center line such that an improved uniformity of color indication is provided a segment of the display cell subtended by each electrode member.

3. In a liquid crystal display cell having two substrate means, a pluality of electrode members formed on at least one of said substrate means for display purposes, spacer members positioned between said two substrate means, and a liquid crystal composition filled between said two substrate means, said liquid crystal display cell when having no liquid crystal composition filled between said two substrate means exhibiting characteristic curved shapes of interference fringes due to differences in thickness of said cell across the area of said cell, said curved shapes collectively defining a characteristic configuration of interference fringes across said area, the improvement comprising:

said electrode members being formed on one of said substrate means and being arranged in a generally curved pattern, said curved pattern being substantially symmetrical about and concave to a center line with said electrode members having increasingly greater curvature as the electrode members become more widely spaced from the center line such that an improved uniformity of color indication is provided a segment of the display cell subtended by each electrode member.

4. In a sound level meter having a liquid crystal display cell which generates different colors corresponding to different sound intensity levels, said liquid crystal display cell having two substrate means, a plurality of electrode members formed on at least one of said substrate means for display purposes, spacer members positioned between said two substrate means, and a liquid crystal composition filled between said two substrate means, said liquid crystal cell when having no liquid crystal composition filled between said two substate means exhibiting characteristic curved shapes of interference fringes due to differences in thickness of said cell across the area of said cell, said curved shapes collectively defining a characteristic configuration of interference fringes across said area, the improvement comprising:

said electrode members being formed on one of said substrate means and being arranged in a generally curved pattern, said curved pattern being substantially symmetrical about and concave to a center line with said electrode members having increasingly greater curvature as the electrode members become more widely spaced from the center line such that an improved uniformity of color indicaion is provided a segment of the display cell subtended by each electrode member.

* * * * *